United States Patent [19]
Feder et al.

[11] 4,018,938
[45] Apr. 19, 1977

[54] FABRICATION OF HIGH ASPECT RATIO MASKS

[75] Inventors: Ralph Feder, Hyde Park; Eberhard A. Spiller, Mount Kisco, both of N.Y.

[73] Assignee: International Business Machines Corporation, Yorktown Heights, N.Y.

[22] Filed: June 30, 1975

[21] Appl. No.: 591,986

[52] U.S. Cl. .................................. 427/43; 96/35.1; 96/36.2; 250/492 R; 427/272; 427/273
[51] Int. Cl.² ........................................... B05D 3/06
[58] Field of Search ........... 96/35.1, 36.2; 250/322, 250/323, 320, 492; 427/43, 36, 272, 273

[56] References Cited
UNITED STATES PATENTS

| | | | |
|---|---|---|---|
| 3,740,280 | 6/1973 | Ronen | 96/36.2 |
| 3,743,842 | 7/1973 | Smith et al. | 96/36.2 |
| 3,767,398 | 10/1973 | Morgan | 96/36.2 |

Primary Examiner—John H. Newsome
Attorney, Agent, or Firm—Pollock, Vande Sande & Priddy

[57] ABSTRACT

A method of constructing masks characterized by a high aspect ratio. The method includes at least a single exposure of a mask by radiation which is transmitted by the substrate before impinging on the resist. In a specific embodiment the mask is partially completed and the already deposited mask modulates the radiation transmitted by the substrate before it exposes the resist.

18 Claims, 8 Drawing Figures

FABRICATION OF HIGH ASPECT RATIO MASKS

FIELD OF THE INVENTION

The present invention provides an improved process for constructing high aspect ratio masks.

BACKGROUND OF THE INVENTION

The present invention is adapted for the construction of improved masks to be used in lithographic transfer of patterns which is itself a process widely employed in the production of integrated circuits and the like. Lithographic transfer of patterns has been developed because integrated circuits and the like require patterns with extremely small dimensions and fine tolerances. All forms of lithographic pattern transfer require a source of radiation and a mask to modulate this source of radiation so as to transfer a desired pattern to a receiver which is coated with a material responsive to the radiation. One particular type of radiation that has been found extremely suitable for lithographic pattern transfer is x-ray illumination. However, a problem has existed in employing x-ray illumination in that it requires careful selection of masking materials as well as relatively high aspect ratios for the masks.

More particularly, it should be apparent to those skilled in the art that a figure of merit for any particular type of mask is the contrast ratio attainable with the mask. That is, the mask is comprised of materials either transmissive, or absorbtive, of the illuminating radiation. The contrast ratio is a figure of merit defining the effectiveness of the mask in absorbing radiation that is not intended for transmission, and at the same time, transmitting the radiation that is intended to be transmitted. One factor which is extremely significant in determining the contrast ratio of any mask is the aspect ratio; the ratio between the height of the masking material versus the width of that material.

Because of the prior art methods of mask manufacturing, a rule of thumb has evolved which has limited the aspect ratio to be less than or equal to one. That is, it has been considered difficult to fabricate masks in which the thickness of the masking material was greater than the width of the material. This has severly hampered the art in reducing the dimensions of components of various integrated circuits for the reason that the final component dimension is proportional to the width of the mask producing it. For instance, platinum and copper have to be at least 0.3 microns thick to give a contrast ratio which is greater than about 3 to 1 for X-rays of a wavelength of 8.3A. Since this contrast ratio is on the borderline for reasonable resist processing such masks have required widths of at least 0.3 microns.

This limitation on the aspect ratio is a function of the prior art method of fabricating masks. In the prior art fine patterned masks have been fabricated employing electron beam illumination. Because of electron scattering, which increases with the thickness of the resist material the previously mentioned rule of thumb has been adopted. In particular a resist is coated on a substrate and illuminated by an electron beam modulated by a suitable mask defining a particular pattern. Most practical systems scan the electron beam across the areas to be exposed and control the intensity of the beam by computer control. The exposed resist may be removed, by developing, and metal or the like plated in the areas vacated by the removed resist. To the extent that the removed resist, and hence the plated metal, is proportional in shape to the mask, the pattern has been effectively transferred. In an effort to increase the thickness of the fabricated mask the resist thickness has been increased. However, electron beam scattering in this thicker resist causes the exposed resist to vary in shape from the mask shape. Thus pattern transfer is degraded by resist thickness greater than about 1–2 microns. Of course, employing prior art techniques, it is still possible to build up thick masks, with reduced effects of electron beam scattering by fabricating the mask in a number of stages. That is, employing prior art techniques, (i.e., relatively thin resists) illuminating the mask to be manufactured by an electron beam modulated by a master mask, an intermediate product is produced. This product is then coated with an additional layer of resist material and a second exposure is effected employing the same master mask and the same electron beam illumination. Of course, any number of exposure steps could be employed to thereby build up the thickness of the mask. The significant drawback to this technique is the problems inherent in registering the master mask with the mask that is being produced in a number of different exposure steps. Any misregistration will result in a degraded product.

It is therefore an object of the present invention to provide a method of constructing a mask having aspect ratios greater than one. It is another object of the present invention to provide an improved method of constructing a mask which is capable of producing a mask having aspect ratios of at least 2 to 1.

It is another object of the present invention to provide a process capable of producing masks with high aspect ratios and at the same time eliminating the alignment or registration problems inherent in multiple exposure techniques.

SUMMARY OF THE INVENTION

These and other objects of the invention are satisfied by employing a process for fabricating a mask in which the final product of the process, i.e. the mask being fabricated, is illuminated through its substrate. By employing this technique the illumination employed during the second, or any subsequent exposure, is modulated by the partially formed mask itself thus eliminating any registration problems in registering a master mask with a mask that is being formed.

In a preferred embodiment of the invention the initial stages of mask fabrication can be that employed in the prior art, namely, electron beam exposure of a resist coated substrate having a thin plating layer between the substrate and resist. Subsequent to this exposure, the resist can be developed and metal plated on the plating layer in the areas in which development removed the resist. At this stage a negative resist is coated on the partially completed mask which may then be illuminated through the substrate. The second illumination preferably employs x-ray illumination. Since the resist being illuminated is a negative resist, those areas which do not receive illumination can be developed away leaving holes in the negative resist layer registered with the previously plated material. An additional plating step now increases the thickness of this plated material. After any number of repeated steps of coating, exposure through the substrate, development and plating, a mask is produced which has a relatively high aspect ratio and thick layers of resist in areas which do not include plated material. If desired the relatively thick resist material can now be removed and the relatively thin plating layer etched away leaving a mask with a high aspect ratio. It should be apparent that the substrate and plating layer must be transparent to the illumination exployed in the exposure of the negative resist through these layers.

BRIEF DESCRIPTION OF THE DRAWINGS

The present invention will now be more particularly described in the following portion of this specification taken in conjunction with the attached drawings in which.

DETAILED DESCRIPTION OF THE DRAWINGS

Figure 1A:
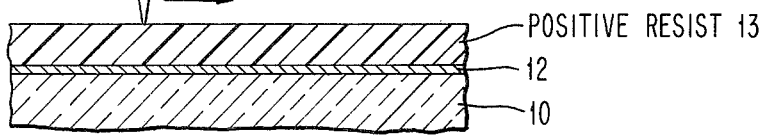
FIGS. 1A through 1G, inclusive, are cross-sections of the product produced by the process of this invention in various stages of fabrication.
Figure 1B:
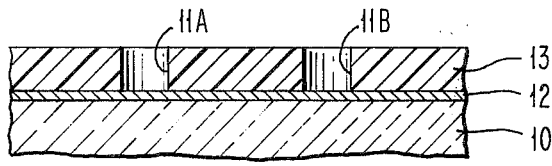
Figure 1C:
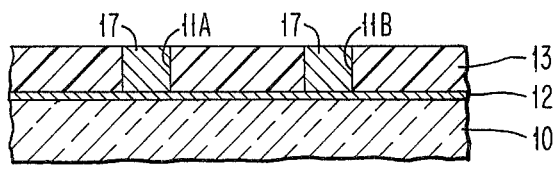
Figure 1D:
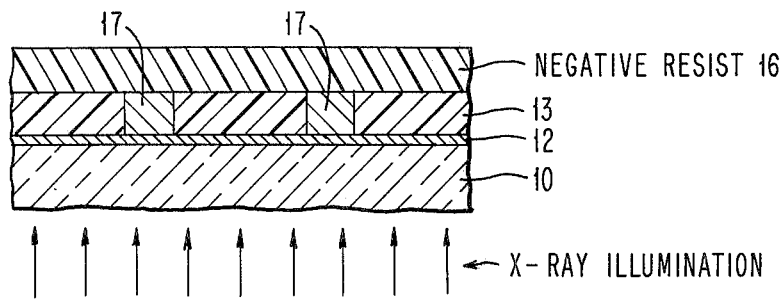
Figure 1E:
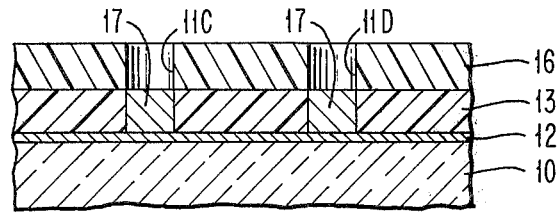
Figure 1F:
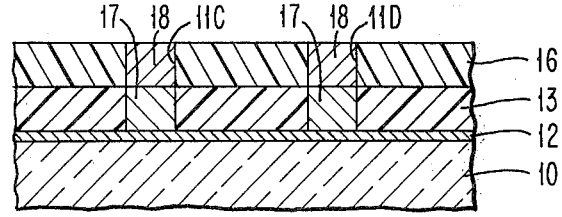
Figure 1G:
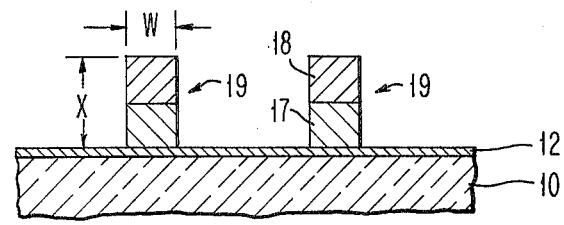

Before describing the invention in detail it will be helpful to the reader to define certain dimensions and ratios with the assistance of FIG. 1G. FIG. 1G schematically illustrates a generalized mask comprising masking elements 19 supported on a substrate 10. Since the objective of the present invention is to provide a mask particularly for lithographic transfer of a pattern employing x-ray illumination, the substrate 10 can in fact be a material which is transmissive of this illumination. On the other hand, since the invention can be employed in constructing masks for photolithographic transfer of patterns using illumination other than x-rays, the substrate 10 can in fact be a material which is transmissive of the illumination employed. The masking material itself is schematically illustrated at 19 although those skilled in the art will understand that this masking material is intended to represent any arbritrary pattern which is desired to be transferred by the mask. We have previously referred to the fact that an object of the present invention is to maximize, or at least increase, the aspect ratio over that heretofore available with prior art processes. In the mask illustrated in FIG. 1G the width of the masking material is indicated by the reference character "W" whereas the height of the masking material is represented by the reference character "X". The aspect ratio is defined as X/W. While many materials can be employed using the principles of this invention, we prefer to employ a substrate of either mylar or berylium. Furthermore, the masking material itself can be platinum, copper or gold. Other elements, such as erbium can be employed for the masking material. In fact, erbium with a 0.2 micron width and a 0.2 micron height (an aspect ratio of 1) will give a contrast ratio of about 3 to 1 for $\lambda = 8.3$ Angstroms which is on the borderline for reasonable resist processing. However, since erbium is very difficult to plate we prefer platinum, copper or gold notwithstanding the fact that these require at least a 0.3 micron thickness to give the contrast ratio that is at least as great as 3 to 1 for $\lambda = 8.3$ Angstroms. Higher contrast ratios are obtained for longer wavelengths and lower ratios for shorter wavelengths.

FIG. 1A illustrates the first step in the process of fabricating a mask employing the principles of our invention. In fact, however, this is a processing step which is typical of the prior art. In particular, a substrate 10 has a thin plating layer 12 deposited thereon. In one embodiment of our invention this layer may be 200 A in thickness and can comprise copper. It may be desirable, in later steps of the process, to selectively remove this plating layer in the presence of later plated masking material. This is facilitated if the plating layer is a material different from the masking material. Although many materials can be used for the plating layer 12 two examples are Cu and NiFe. Atop the plating layer 12 a positive resist 13 has been coated. The thickness of this coating is on the order of the smallest line width in the pattern. This structure is then illuminated by an electron beam 15 which is modulated by a computer controlled mask. In this regard see "Electron Beam Lithography for Complex High Density Devices", Chang et al in 6th International Conference in Electron and Ion Beam Science Technology, Electro Chemical Society, pp. 580 (1974).

After illumination the structure shown in FIG. 1A is developed, and the resulting intermediate product is illustrated in FIG. 1B. In FIG. 1B the resist 13 now has a number of "holes" (11A and 11B, for example) exposing the plating layer 12. Of course, the pattern of holes removed from the resist layer 13 is dependent upon the master mask and the manner in which it modulates the electron beam 15.

FIG. 1C illustrates the intermediate product after metal (such as Au, Cu or Pt) is plated in the holes 11A and 11B. This metal forms part of the masking material. It will be seen, that the plating has been accomplished without removing the resist 13.

Subsequently, an additional resist 16 is coated on the intermediate product (or carrier) of FIG. 1C. This resist 16 is preferably a negative resist and can be spun coated.

The structure of FIG. 1D is now illuminated with x-ray radiation through the substrate 10 so as to expose those portions of resist 16 which are not protected by the previously plated areas 17.

It will be apparent that the previously exposed areas 11A and 11B, which have been plated with material such as platinum, copper or gold, serve to modulate the x-ray illumination in the same manner that the mask modulated the electron beam 15 in transferring a particular pattern to the initial resist coating. It is particularly significant that no mask is required during the second illumination. As a result, misregistration cannot occur.

Subsequent to the second illumination step, the negative resist 16 is developed. Since it is a negative resist, the unexposed areas are removed leaving "holes" 11C and 11D through the resist 16 to the previously plated areas 17. Subsequent to the development step, the partially completed fabrication now takes the form illustrated in FIG. 1E.

Subsequent to the development process, additional plating is carried out so as to raise the height of the plated areas 17 to be equal to the height of the negative resist layer 16. This adds additional height to the masking material. Subsequent to the second plating operation the fabricated structure takes the form illustrated in FIG. 1F in which the additional plating is identified by reference character 18.

If desired, this structure can be employed as a mask using x-ray illumination. The plated areas 17 and 18 will serve to absorb the x-ray illumination such that areas protected by these areas will not be illuminated. On the other hand, areas not protected by the plated areas 17 and 18 will be illuminated by the x-ray radiation through the substrate 10, the plating base 12 and the resist layers 13 and 16. However, for increased contrast ratio it may be desirable to remove this unnecessary material.

Thus, the resist layers 13 and 16 can now be removed in a manner well known to those skilled in the art. For example, positive resist layer 13 may comprise polymethylmethacrylate which can be removed with methyl isobutyl ketone, and negative resist 16 can comprise KTFR which can be stripped with Kodak stripper J 100, which is tetrachloroethylene, O-dichlorobenzene, p-dichlorobenzene, and phenol.

Subsequent to removal of the resist layers 13 and 16 the plating base 12 can also be removed by etching in a suitable bath. A suitable etchant bath for a Cu plating layer 12 to selectively etch the Cu in the presence of masking material 18 (Au or Pt) is ammonium chloride saturated with NaCl, or ammonium persulfate with mercuric chloride or solutions of ferric chloride. For selectively etching Nichrome or Nickel based magnetic alloys selective etching can be accomplished with the solutions of ferric chloride or a nitric acid, hydrochloric acid and water solution with one part nitric acid, one part hydrochloric acid and 3 parts water. Of course, the plating base layer 12 underlying the plated areas 17 and 18 will not be attacked since this area is protected.

Subsequent the etching step the completed mask takes the configuration shown in FIG. 1G where reference character 19 identifies plated layers 17 and 18.

The process of fabricating the mask has now been explained. Those of ordinary skill in the art will understand that additional layers of negative resist 16 may be coated on the structure shown in FIG. 1F. For each such additional layer, subsequent to coating of the intermediate product, a step of x-ray illumination is accomplished followed by a developing step and an additional plating step. These four steps can be carried out as many times as desired to build up the height of the plated areas 17 and 18 to any desired extent. Since each of the second or subsequent illumination steps will have the radiation modulated by the previously plated areas 17 and 18, etc. there is no registration problems to overcome.

Notwithstanding the advantage of this process in that it allows multiple exposures without registration problems, we have found that only a single negative resist layer 16 with the concomitant illumination, developing and plating steps are required to build up the height of the mask to greater than one micron desired thickness, to give the desired aspect ratio of at least 2.

Once the completed mask is available it can be employed to generate other masks or to generate devices which are, of course, the desired end result. Since those of ordinary skill in the art are well acquainted with the manner in which a mask is employed to generate other masks or to generate completed devices, it is not believed necessary to describe here, the manner in which this function is accomplished.

Figure 2:
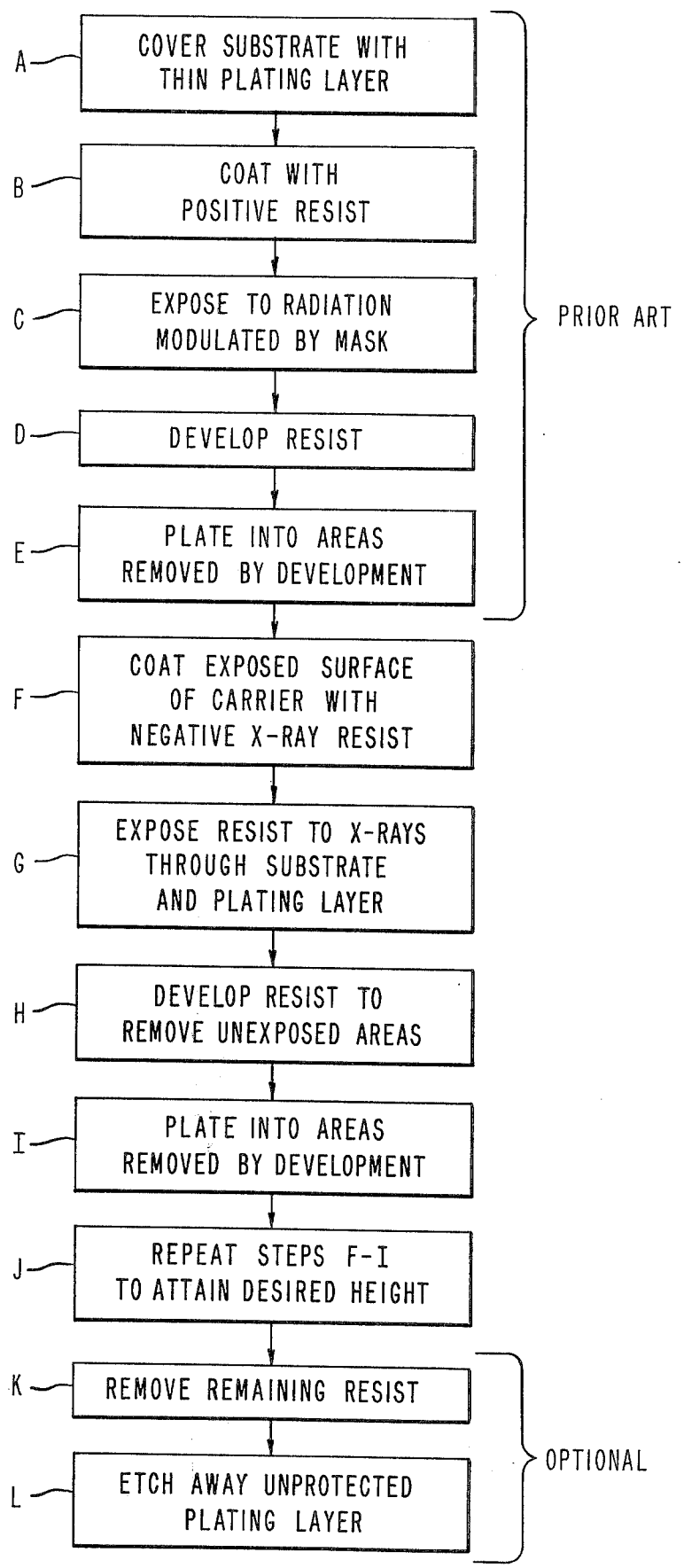
FIG. 2 is a flow diagram illustrating the process steps of the invention.

FIG. 2 illustrates, in flow diagram form, the various steps of the method of this invention. A substrate which is transmissive of the selected radiation is covered (step A) with a thin (about 200A) plating layer. The plating layer deposited is chosen to be compatible with the desired masking material. Gold, copper and platinum are examples. A positive resist coating is then applied (step B). Of course, the material of this coating is chosen dependent on the radiation used in the next step, exposure (step C). After exposure, the resist is developed (step D) and a suitable masking material is plated (step E) into the "holes." Again for a mask to be used in x-ray lithography, such material would be a good x-ray absorbent material, such as copper, platinum or gold. As indicated in FIG. 2, the steps A–E are typical of prior art processes.

Now the carrier (or intermediate product) is coated (step F) with a suitable resist, such as a negative x-ray resist. The coated carrier is then exposed to x-rays (step G) with the substrate lying between the resist and the x-ray source so that the previously plated material modulates the radiation which exposes the resist. The resist is then developed (step H) to remove the unexposed areas. Additional plating metal is then provided (step I) into the "holes" left by the removed resist.

Steps F-I are effective to add to the height of the mask and thus to increase the aspect ratio. These steps may now be repeated, as desired, to increase the height of the mask. With the last plating step, the process is essentially complete in providing the desired high aspect ratio mask. However, if desired, steps K and L may be effected to remove the unnecessary resist and unprotected plating layer.

If the inventive process is to be performed employing x-ray radiation, the substrate should be transmissive of that radiation. Furthermore, the substrate must have sufficient mechanical strength to support the mask. Most compounds of the light elements are sufficiently transmissive of x-rays to be employed as well as some of the light elements themselves. In addition, of course, the particular material selected should be a solid capable of being prepared in thin film form. Some examples of suitable materials are organic compounds with sufficient mechanical strength, such as mylar; Be; $Si_3N_4$; $SiO_2$; Si; $Al_2O_3$; $B_4C$; BN; C; and $B_2O_3$.

Although a preferred embodiment of the present invention has been described, those of ordinary skill in the art will be aware that numerous changes and modifications can be made without departing from the spirit and scope of this invention. In particular, materials other than those specifically mentioned can be employed for the substrate, the plating layer and the mask material. Furthermore, although we have mentioned that x-ray illumination is preferably employed, those of ordinary skill in the art will understand that other types of radiation, such as ultraviolet radiation can also be employed with suitably chosen materials.

What is claimed is:
1. A method of manufacturing a mask characterized by an aspect ratio > 1 comprising the steps of:
   a. providing a mask of aspect ratio 1 on a substrate transparent to radiation, said mask defined by selective areas absorbent of said radiation and,
   b. coating said mask with material which becomes insoluble in a developer in response to said radiation,
   c. exposing said mask and said material to said radiation with said substrate located between said mask and a source of said radiation,
   d. developing said material, and
   e. plating masking material absorbent to said radiation in areas in which said radiation responsive material was removed by said developing whereby the height of said radiation absorbent masking material is increased to thereby increase the aspect ratio of said mask.

2. The method of claim 1 in which said radiation comprises x-rays.

3. The method of claim 1 in which said substrate is selected from the group of mylar, Be, $Si_3N_4$, $SiO_2$, Si, $Al_2O_3$, $B_4C$, BN, C, and $B_2O_3$.

4. The method of claim 1 in which the material employed in said coating step is a negative resist.

5. The method of claim 1 wherein said plating step is carried out to provide a mask height of at least one micron.

6. The method of claim 1 wherein said steps of coating, exposing, developing and plating are carried out a plurality of times.

7. The method of claim 1 wherein said steps of coating, exposing, developing and plating are carried out until the aspect ratio of said masking material is at least equal to 2.

8. The method of claim 1 wherein said providing step includes,
coating said substrate with a positive resist material, exposing said coated substrate to radiation modulated by a master mask, developing said resist, and plating radiation absorbent metal into the areas from which resist was removed during said developing step.

9. The method of claim 8 in which metal plating step is followed by a step of removing resist remaining on said substrate.

10. The method of claim 8 in which step of exposing said coated substrate employs an electron beam.

11. The method of claim 8 in which said step of coating said coated substrate is preceded by a step of depositing a plating layer.

12. The method of claim 9 in which said plating layer is in the range of 200 A.

13. The method of claim 12 in which said plating layer is Cu. of:

14. A method of increasing the aspect ratio of a mask, having an aspect ratio less than 1, to an aspect ratio greater than 1, in which the mask, whose aspect ratio is to be increased is formed of a material absorptive of X-radiation on a substrate transmissive of X-radiation, said method comprising the steps of:
a. coating said mask with a material which becomes insoluble in a developer in response to said X-radiation;
b. exposing said mask and said material to X-radiation with said substrate located between said mask and a source of X-radiation;
c. developing said material; and,
d. plating additional masking material, absorbent to X-radiation, in areas in which said radiation responsive material was removed by said developing whereby the height of said radiation absorbent masking material is increased to thereby increase the aspect ratio of said mask.

15. The method of claim 14 in which each of said steps a–d is carried out at least twice.

16. The method of claim 14 in which said step (a) is carried out with a negative resist material.

17. The method of claim 14 wherein said substrate is selected from the group of mylar Be, $Si_3N_4$, $SiO_2$, Si, $Al_2O_3$, $B_4C$, BN, C and $B_2O_3$.

18. The method of claim 14 in which said masking material is selected from the group consisting of gold, copper and platinum.

* * * * *

UNITED STATES PATENT OFFICE
CERTIFICATE OF CORRECTION

Patent No. 4,018,938  Dated April 19, 1977

Inventor(s) Ralph Feder et al.

It is certified that error appears in the above-identified patent and that said Letters Patent are hereby corrected as shown below:

Column 6, line 51 (claim 1) add after "ratio" -- $\leq$ --.

Signed and Sealed this

Twenty-ninth Day of November 1977

[SEAL]

Attest:

RUTH C. MASON
Attesting Officer

LUTRELLE F. PARKER
Acting Commissioner of Patents and Trademarks